United States Patent [19]

Milkovic

[11] 4,255,705
[45] Mar. 10, 1981

[54] PEAK DETECTION AND ELECTRONIC COMPENSATION OF D. C. SATURATION MAGNETIZATION IN CURRENT TRANSFORMERS USED IN WATT HOUR METER INSTALLATIONS

[75] Inventor: Miran Milkovic, Scotia, N.Y.
[73] Assignee: General Electric Company, Somersworth, N.H.
[21] Appl. No.: 78,058
[22] Filed: Sep. 24, 1979
[51] Int. Cl.$^3$ .......................... G01R 1/20; G05F 1/12
[52] U.S. Cl. .................................. 324/127; 323/357; 324/110
[58] Field of Search .................... 324/127, 110; 323/6, 323/48

[56] References Cited

U.S. PATENT DOCUMENTS

| 3,665,125 | 5/1972 | Valbonesi | 179/170 R |
| 4,096,363 | 6/1978 | Earp | 323/6 |

Primary Examiner—Ernest F. Karlsen
Attorney, Agent, or Firm—Robert E. Brunson

[57] ABSTRACT

A watt hour meter installation is described which is of the type including an input transformer having an input winding for connection to an alternating current power supply line, an output winding for connection to a watt hour meter for measuring alternating current power being consumed and a bore on which the input and output windings are wound. The core is of the type which is susceptible to DC magnetization by a DC component superimposed on the alternating current being measured. In order to overcome the effect of the DC component on the magnetization characteristics of the input transformer, automatic compensation circuitry is provided which includes a sensor coupled to sense the current flowing through the input winding and for deriving a sensed output signal proportional to the sensed current and which includes both AC and DC components of the input current. A sensed signal processing circuit is provided in the form of positive and negative peak voltage detecting and holding circuit together with a summation circuit and voltage to current converter for deriving from the sensed signal a feedback signal which is proportional only to the DC component of the current flowing in the input winding. This feedback signal is supplied through a compensating winding wound on the input transformer core in a direction to automatically cancel out the effects of the superimposed DC component on the saturation characteristics of the input transformer.

7 Claims, 5 Drawing Figures

PEAK DETECTION AND ELECTRONIC COMPENSATION OF D. C. SATURATION MAGNETIZATION IN CURRENT TRANSFORMERS USED IN WATT HOUR METER INSTALLATIONS

BACKGROUND OF INVENTION

1. Field of Invention

This invention relates to a new and improved method and apparatus for sensing the value of a direct current (DC) component superimposed on an alternating current (AC) being measured by a watt hour meter installation and for deriving a feedback signal for nulling out the effect of the DC component on the supply AC being measured.

More particularly, the invention relates to a relatively simple and low cost peak detection method and circuit for achieving the above-described compensation of a DC component superimposed on a supply alternating current being measured in a watt hour meter installation.

2. Background Problem

It has become a practice of certain consumers of electricity who wish to lower their utility bills to resort to various measures which seriously affect the capability of a watt hour meter installation to obtain a true measure of the electricity being consumed. For example, if a diode is placed in series with the load at a consumer's dwelling or commercial installation, a direct current component is superimposed on the alternating current flowing through the load. If the particular watt hour meter installation in question is designed such that it employs a current transformer for sensing the value of the supply alternating current, the direct current component superimposed on the alternating current can result in a DC magnetizing current flowing in the current transformer which tends to saturate the core of the transformer. If saturation does occur, the current transformer no longer is capable of operating over the linear portion of its magnetization characteristic and is incapable of inducing a signal in the secondary winding of the transformer which is truely proportional to the input AC. Hence, if the current transformer is part of an electronic or solid state watt hour meter, and its core is saturated in the above manner, the watt hour meter is rendered ineffective for accurately measuring the power being consumed by the load at the installation in question.

U.S. patent application Ser. No. 33,078 filed Apr. 25, 1979 in the name of Miran Milkovic, the inventor of the present invention, for "MEANS FOR AUTOMATICALLY COMPENSATING DC MAGNETIZATION IN A TRANSFORMER" and assigned to the General Electric Company, the assignee of the present ivnention, describes a new and improved compensating means for counteracting direct current saturation to a current transformer in an electronic watt hour meter. However, the means described in application Ser. No. 33,078 requires the use of two current transformers and relatively expensive Hall elements.

The present invention describes a new and improved lower cost, peak detection method and circuit employing only a single current transformer for sensing the value of a direct current component superimposed on an alternating current supply being measured by a watt hour meter installation and for deriving a feedback signal for nulling out the effect of the DC component on the supply AC being measured.

SUMMARY OF INVENTION

In practicing the invention, the effect of a DC component superimposed on a supply alternating current being measured by watt hour meter installation is nullified. This nulling effect is achieved by sensing the combined value of the supply alternating current having the DC component superimposed thereon and deriving a sensed signal output proportional to both the supply AC and the superimposed DC component. The sensed signal is then converted to a sensed voltage signal. The peak voltage values of both the positive and negative voltage peaks of the sensed voltage signal are detected and held at least over a period of the supply alternating current. The positive and negative peak voltage values are summed together to derive a summation signal representative of the DC component superimposed on the supply alternating current. This summation signal then is fed back in advance of the watt hour meter installation in a direction so as to null out the DC component superimposed on the supply alternating current being measured by the installation.

The above desirable result is achieved in a watt hour meter installation of the type requiring only a single current transformer having an input winding for connection to an alternating current power supply line, an output winding for connection to a watt hour meter for measuring the alternating current power being consumed and a core on which said input and output windings are wound and which is susceptible to DC magnetization by a DC component superimposed on the alternating current power being measured. The improvement further comprises circuitry for compensating for the effect of the DC component on the power measurement acheived with the watt hour meter installation and which comprises a sensor coupled to sense the current flowing through the input winding and for deriving a sensed output signal proportional to the sensed current and which includes the AC and DC components of the current flowing through the input winding. A sensed signal processing circuit is coupled to the sensor for deriving from the sensed output signal a feedback signal which is proportional only to the DC component of the current flowing through the input winding. The sensed signal processing circuit comprises a current to voltage signal conversion circuit supplied with the sensed signal for converting the sensed signal to a sensed voltage signal. Peak signal detecting circuits are supplied with the sensed voltage signal and comprise both positive polarity and negative polarity peak voltage detecting circuits for peak detecting and holding both the positive and negative polarity peak voltage outputs over at least one full cycle of the supply alternating current. A summation circuit is supplied with the output from the peak detecting and holding circuit for summing together the respective output peak voltage signals and deriving a summation output signal which is proportional to the superimposed DC component. A voltage to current signal conversion circuit is supplied with the summation signal from the summing circuit for converting the summation signal to a current feedback signal. The current feedback signal is then supplied to a compensating winding wound on the transformer core in a direction to automatically cancel out the effect of the superimposed DC component on the saturation characteristics of the input transformer

BRIEF DESCRIPTION OF DRAWINGS

These and other objects, features and many of the attendant advantages of this invention will be appreciated more readily as the same becomes better understood by reference to the following detailed description when considered in connection with the accompanying drawings, wherein like parts in each of the several figures are identified by the same reference character, and wherein.

DETAILED DESCRIPTION OF PREFERRED EMBODIMENT

Figure 1:
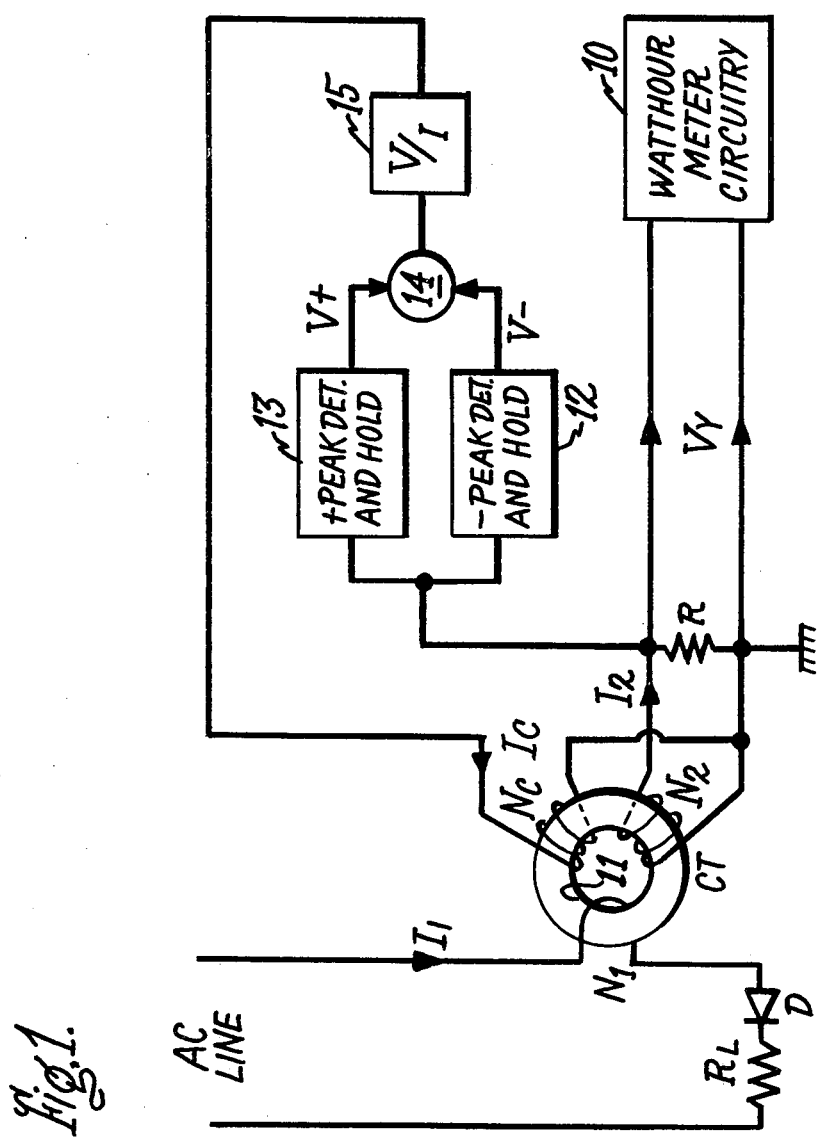
FIG. 1 is a schematic block diagram of an electronic compensation circuit employing a peak detection and hold technique for use in practicing the invention.

FIG. 1 is a functional block diagram of a novel peak detection and electronic compensation circuit for practicing the method according to the invention to automatically prevent DC saturation magnetization in current transformers used in watt hour meter installations. In FIG. 1 an electricity consumer's load is illustrated by the resistor $R_L$ and it is assumed that the consumer has in some manner connected in series with the load circuit a diode D which could have an adverse effect on the accuracy of the reading of a watt hour meter installation indicated at 10, as discussed in the preceding paragraphs. The watt hour meter installation 10 may be of the solid state electronic type as described in U.S. Pat. Nos. 3,955,138; 3,875,508; 4,066,959 or 4,066,960, for example, and has one of its inputs supplied from an input current transformer CT coupled to the alternating current supply line that supplys the load $R_L$. The input current transformer CT is comprised by a core member 11 having an input winding $N_1$ wound thereon together with an output winding $N_2$ and a compensating winding $N_C$, the purpose of which will be described more fully hereafter. With this arrangement, it will be seen that current $I_1$ supplied to the load $R_L$ must flow through the input winding $N_1$. This results in the production of magnetic lines of flux in the core CT which will induce an output current in the output winding $N_2$ that is supplied to the input of the watt hour meter circuitry 10.

Figure 3A:
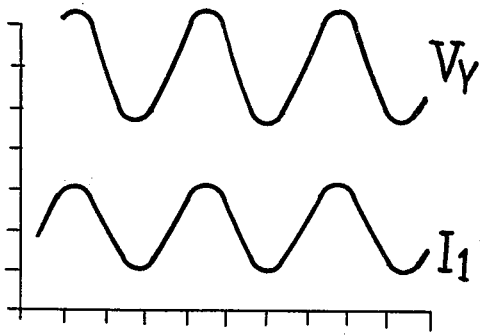
FIGS. 3a–3c are a series of waveforms illustrating operation of the embodiment of the invention shown in FIGS. 1 and 2.

Because of the presence of diode D in the input primary circuit, the current transformer CT will be magnetized by a DC flux superimposed on an AC flux. Because of the presence of the superimposed DC flux, the core of the current transformer 11 will tend to saturate at large values of the primary current $I_1$. Upon this occurrence, the current transformer 11 will not operate in the linear region of its magnetization characteristic and as a result the waveshape of the output current $I_2$ derived from the output winding $N_2$ will be distorted. FIG. 3a of the drawings illustrates the characteristic waveform of the voltage $V_Y$ obtained across the sensor resistor R for an assumed input supply current $I_1$ where no diode D is connected in series with the load $R_L$. Under such conditions, it will be appreciated that the output voltage waveform $V_Y$ upon which the watt hour meter measurements will be predicated, is a truthful replica of the input current waveform $I_1$. Thus, without the diode D the waveform of $V_Y$ is not distorted, both half waves are of equal amplitude, and no DC magnetization saturation of the core 11 of the current transformer CT will occur.

Figure 3B:
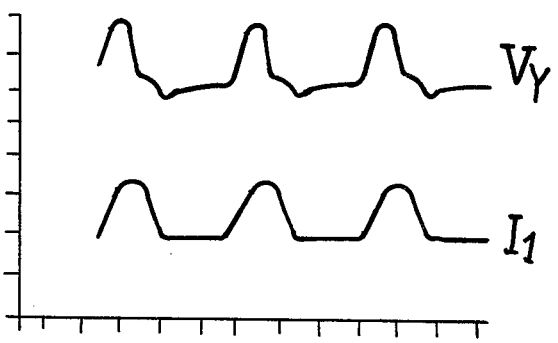

In contrast to the situation of FIG. 3a, with the diode D included in the primary circuit of current transformer CT, there will be a buildup of DC flux in the core 11 of current transformer CT which at large input current magnitudes, eventually will saturate the core and result in a distorted output waveform such as shown at $V_Y$ in FIG. 3b of the drawings.

In order to prevent DC saturation of the current transformer core 11 in the above-discussed manner, a compensating winding $N_C$ is added to the transformer core 11. The arrangement is such that a compensating current $I_C$ is supplied to the winding $N_C$ in a direction and a magnitude such that the flux due to the compensating winding $N_C$ compensates the flux due to the direct current flowing in the primary winding $N_1$ as a result of the superimposed DC component. For this condition, it will be necessary for the relationship $I_{DC} \cdot N_1 = I_C \cdot N_C$ to be maintained. Thus, in order to achieve the desired compensation a current $I_C = I_{DC} N_1/N_C$ must be derived and supplied to the compensating winding $N_C$ in a direction such that the lines of flux produced by $I_C \cdot N_C$ nulls the lines of flux $I_{DC} \cdot N$ produced by the superimposed DC component.

In order to derive the desired compensating current $I_C$, suitable processing circuitry is provided for processing the sensed signal $V_Y$ appearing across the sensing resistor R and converting it to the desired compensating current $I_C$ for supply to the compensating winding $N_C$. This processing circuitry is comprised by two peak detector and hold circuits 12 and 13 wherein the peak detector and holder circuit 12 derives an output voltage $V-$ which is representative of the negative peak voltage value of the distorted waveform voltage appearing across the sensor resistor R. Peak detector and hold circuit 13 derives a positive peak voltage value output signal $V-$ which is representative of the positive peak voltage value of the distorted waveform sensed signal appearing across sensor resistor R. The peak detector and hold circuit output voltages $V-$ and $V+$ are supplied to a summing circuit 14 which sums together each of these voltage signals and derives an output summation signal that is supplied through a voltage to current converting circuit 15 and fed back through the compensating winding $N_C$. The feedback current $I_C$ delivered by the voltage to current coverter 15 to compensating winding $N_C$ is controlled by the difference in values of the negative and peak voltage value signals $V-$ and $V-$.

Figure 3C:
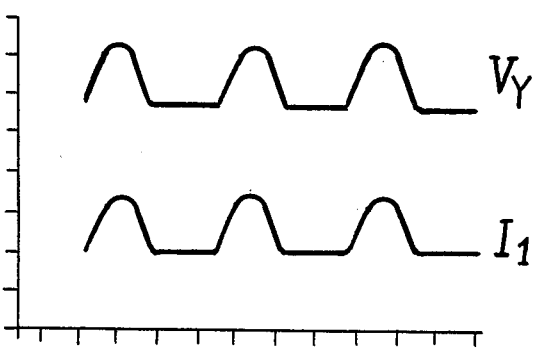

As illustrated in FIG. 3b, when the core 11 of current transformer CT approaches or reaches saturation, the positive and negative peak value of $V_Y = I_2 R$ will be different. Consequently, the peak detector and hold circuits will detect and store, at least over one full cycle of the supply alternating current, the positive and negative peak amplitude values $V+$ and $V-$ of the sensed signal $V_Y$ appearing across the sensor resistor R. The summing circuit 14 sums together the peak voltage values $V+$ and $V-$ and supplies any difference voltage to the voltage to current converter 15. Converter 15 converts the difference voltage to a proportional current value which is supplied through compensating winding $N_C$ in a direction to null the DC saturation tendency of core 11. Thus, as a result of the compensating current $I_C$ supplied through compensating winding $N_C$, the core 11 of current transformer CT is desaturated to the extent that it otherwise would be saturated by the DC component. This allows the transformer core's magnetization to return to the linear portion of its magnetization characteristic and results in restoring the waveform of the sensed output signal $V_Y$ appearing across sensor resistor R as shown in FIG. 3c. From FIG. 3c it will be seen that both the sensed output voltage $V_Y$ and supply input current $I_1$ are of the same waveshape and will result in accurate reading of the watt hour meter coupled to the output winding $N_2$.

Figure 2:
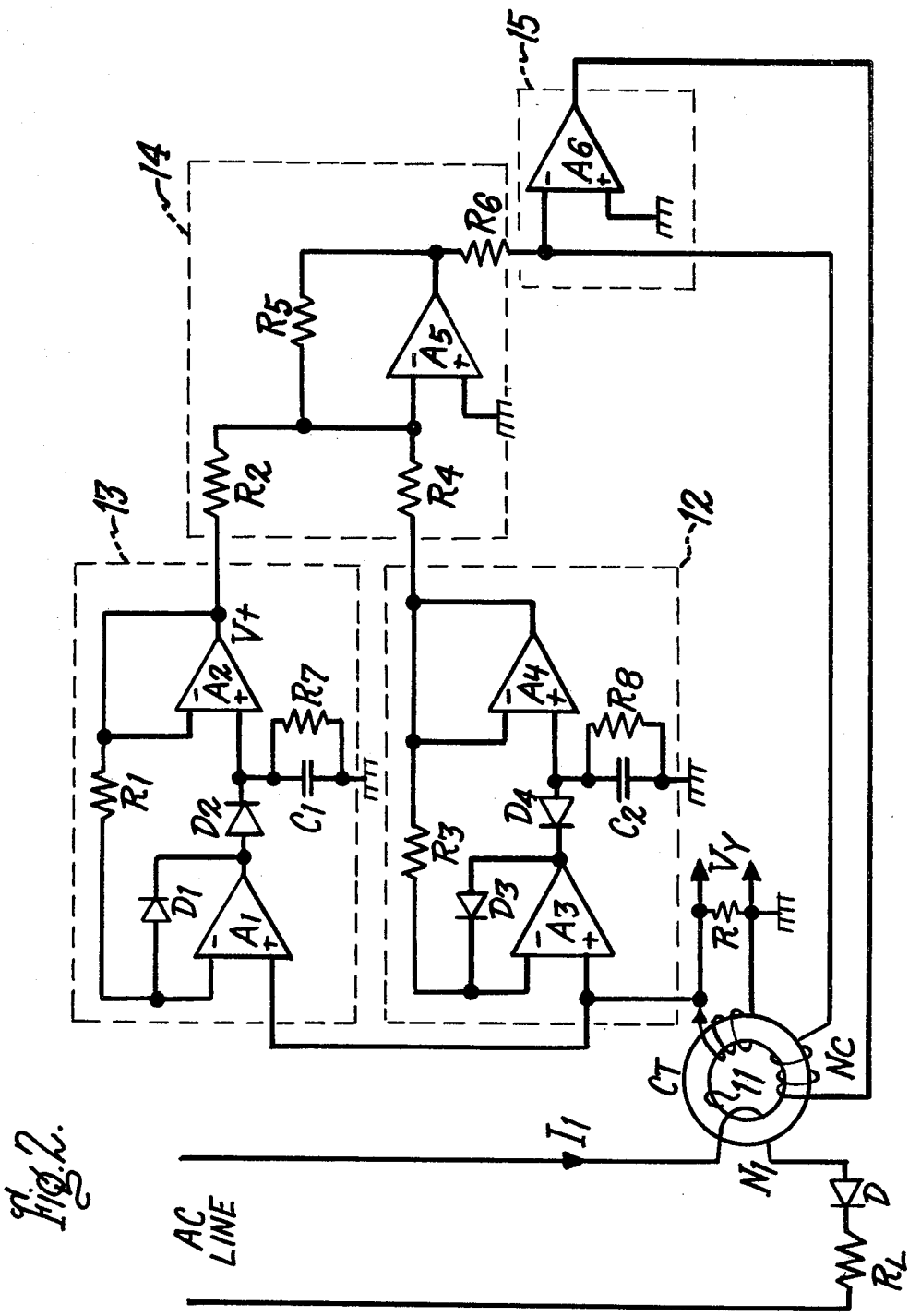
FIG. 2 is a more detailed circuit diagram of the peak detecting and holding circuitry together with summation circuit and voltage to current conversion circuit employed in the compensation circuit arrangement shown in block diagram form in FIG. 1.

FIG. 2 is a detailed electronic circuit diagram of a preferred form of construction for the processing circuitry comprised by the negative and positive peak detecting and hold circuits 12 and 13, the summation circuit 14 and the voltage to current conversion circuit 15. In FIG. 2 it will be seen that the output voltage $V_Y$ appearing across the sensor resistor R is supplied in parallel to the direct input terminal of an operational amplifier $A_1$ employed in the positive peak detecting and holding circuit 13 and to the direct input terminal of an operational amplifier $A_3$ comprising a part of the negative peak detecting and hold circuit 12. Each of the operational amplifiers $A_1$ and $A_2$, as well as other operational amplifiers to be referred to hereinafter, may comprise conventional, commercially available operational amplifiers such as those described in a textbook entitled "Applications of Operational Amplifiers"—J. C. Graeme, published by the Mc Graw Hill Book Company of New York, N. Y. The negative peak voltage detecting and holding circuit 12 is further comprised by a second stage operational amplifier $A_4$ having its direct input connected to the output of first-stage operational amplifier $A_3$ through a diode $D_4$. Diode $D_4$ is poled so as to produce a negative voltage value $V-$ at the output of the second-stage operational amplifier $A_4$ which is representative of the peak value of the negative voltage peak occuring in the sensed voltage input $V_Y$. To hold this negative peak voltage value, at least over one complete cycle of the supply alternating current, a capacitor $C_2$ and a resistor $R_8$ are connected between the juncture of diode $D_4$ with the direct input terminal of the second-stage operational amplifier $A_4$ and a source of reference potential (ground). The time constant of $C_2$, $R_8$ should be larger than 16.6 milliseconds for a current of 60 hertz. To complete the circuit, the first-stage operational amplifier $A_3$ is connected back to the inverse input terminal of first-stage operational amplifier $A_3$ via a diode $D_3$ which is poled in the same direction as the diode $D_4$ and the output of the second-stage operational amplifier $A_4$ is connected back to the inverse input terminal of the first-stage operational amplifier $A_3$ via a feedback resistor $R_3$.

The positive peak detecting and hold circuit 13 is comprised of first and second stage operational amplifiers $A_1$ and $A_2$ interconnected in the same manner as described above with respect to the negative peak voltage detecting and hold circuit 12, with the notable exception that the interstage coupling diode $D_2$ and the first-stage operational amplifier feedback diode $D_1$ are poled inversely with respect to the corresponding diodes $D_4$ and $D_3$.

The negative and positive peak voltage values appearing at the output of the circuits 12 and 13 are supplied across resistors $R_4$ and $R_2$, respectively, to the input of an operational amplifier $A_5$ which comprises the summing circuit 14. The resistors $R_2$ and $R_4$ constitute input summing resistors which are connected in parallel to the inverse input terminal of operational amplifier $A_5$. The direct input terminal of summing amplifier $A_5$ is connected to a source of reference potential (ground) and the output terminal is connected back to the inverse input terminal through a feedback resistor $R_5$. As a result of this construction, operational amplifier $A_5$ serves to sum together the input negative and positive peak voltage values appearing across the resistors $R_2$ and $R_4$ and to supply to an output resistor $R_6$ a summation output voltage value which is proportional to the difference between the negative peak voltage value $V-$ and the positive peak voltage value $V+$.

The summation difference voltage signal appearing across output resistor $R_6$ is supplied to the inverse input terminal of an operational amplifier $A_6$ which comprises the voltage to current conversion circuit 15. Operational amplifier $A_6$ has its direct input terminal connected to a source of reference potential (ground) and its output terminal is connected back through compensating winding $N_C$ to the inverse input terminal. As a result of this connection, the current $I_C$ applied at the output of operational amplifier $A_6$ will be proportional to the direct current component superimposed on the supply alternating current $I_1$ flowing through the input winding $N_1$ and will desaturate the core 11 of current transformer CT to an extent necessary to overcome the effect of the superimposed DC component. Since the compensating winding $N_C$ is located in the feedback loop of operational amplifier $A_6$, the current $I_C$ supplying winding $N_C$ will be driven from a high impedance source.

While a preferred form of peak detecting and hold circuitry has been disclosed, other known circuit means for peak detection and hold as well as summation and voltage to current conversion could be used such as those described in the above-referenced textbook entitled "Applications of Operational Amplifiers"; however, because of the comparatively low cost and stable operation afforded, the arrangement shown in FIG. 2 is preferred. Additionally, in place of sensing resistor $R_3$, an active load could be used to obtain the voltage $V_Y$ for processing by the peak detecting and hold circuitry as described in U.S. Pat. No. 3,815,013 to M. Milkovic, assigned to the General Electric Company.

The input current transformer CT together with the automatic compensation circuitry comprised by the peak detecting and holding circuits 12 and 13, summation circuit 14, voltage to current conversion circuit 15 and associated compensating winding $N_C$ could be substituted in place of any current transformer used as an input current transformer for a watt hour meter installation. For example, in the electronic watt hour meter disclosed in U.S. Pat. No. 3,955,138, the input current transformer could be removed and the input current transformer CT together with its associated automatic compensation circuitry 13–15 and compensating winding $N_C$ could be substituted in its place by connecting the resistor R across the terminals 28 and 30 of the meter shown in FIG. 1 of U.S. Pat. No. 3,955,138. Similar substitutions could be made in the watt hour meter installations described in U.S. Pat. Nos. 3,875,508; 4,066,959 or 4,066,960, for example. All of U.S. Pat. Nos. 3,955,138; 3,875,508; 4,066,959; 4,066,960 and 3,815,013 are assigned to the same assignee as the present invention and are by the same inventor as the present invention.

From the foregoing description, it will be appreciated that the invention provides a new and improved method and circuitry for nulling out the effect of a DC component superimposed on a supply alternating current being measured by a watt hour meter installation. The method and circuity comprises sensing the combined value of the supply alternating current with the DC component superimposed thereon and deriving a sensed signal output representative of both the supply AC and superimposed DC component. The sensed signal is converted to a sensed voltage signal and both the positive and negative voltage swings of the voltage signal are peak detected and held. The positive and negative peak voltage values are then summed together to derive a summation signal output which is representative of the superimposed DC component. This summation output signal is then fed back in advance of the watt hour meter installation in a direction to null out the DC component superimposed on the supply alternating current being measured. This is achieved without requiring an additional current transformer and using relatively simple, low cost and proven circuit components.

Having described a preferred embodiment of a new and improved method and circuitry for sensing the value of a direct current component superimposed on the supply alternating current being measured by a watt our meter installation, and for deriving and feeding back a feedback signal for nulling out the effect of the DC component on the supply alternating current being measured, it is believed obvious that other modifications and variations of the invention are possible in the light of the above teachings. It is therefore to be understood that changes may be made in the particular embodiment of the invention described which are within the full intended scope of the invention as defined by the appended claims.

What is claimed is:

1. In a watt hour meter installation of the type including an input transformer having an input winding for connection to an alternating current power supply line, an output winding for connection to a watt hour meter for measuring alternating current power being consumed and a core on which said input and output windings are wound and which is susceptible to magnetization saturation by a D. C. component superimposed on the alternating current power being measured; the improvement comprising automatic compensation circuit means for compensating automatically for the effect of the D. C. component on the power measurement achieved with the watt hour meter installation; said automatic compensation circuit means comprising:
   (a) sensing means coupled to sense the current flowing through said input winding and for deriving a sensed output signal proportional to the sensed current and which includes the A. C. and the D. C. components of the current flowing through said input winding,
   (b) sensed signal processing circuit means coupled to said sensing means for deriving from said sensed output signal a feedback signal which is proportional to the D. C. component of the current flowing through said input winding, said sensed signal processing circuit means comprising
      (i) current to voltage signal conversion circuit means supplied with said sensed signal for converting the same to a voltage signal,
      (ii) peak voltage signal detecting circuit means supplied with said voltage signal,
      (iii) holding circuit means responsive to the output from said peak voltage signal detecting circuit means for holding the peak voltage output thereof over at least one full cycle of the supply alternating current,
      (u) summation circuit means responsive to the peak voltage output for deriving a difference signal proportional to the superimposed D. C. component,
      (v) voltage to current signal conversion circuit means responsive to the output from said summation circuit means for converting the difference signal to a current signal for use as the feedback signal, and
   (c) compensating winding means wound on said input transformer core having said feedback signal supplied thereto in a direction to automatically cancel out the effects of the D. C. component on the magnetization characteristics of said input transformer.

2. A watt hour meter installation according to claim 1 wherein said peak signal detecting circuit means comprises positive polarity voltage peak detecting circuit means and separate negative polarity voltage peak detecting circuit means, said holding circuit means comprises separate holding circuit means for the respective positive and negative polarity voltage peak detecting circuit means peak voltage signal outputs and said summation circuit means sums together the respective output voltage signals from the positive and negative voltage peak detecting and holding circuit means and supplies the summation output signal to the voltage to current signal conversion circuit means for derivation of the feedback signal.

3. A watt hour meter installation according to claim 1 wherein said sensing means comprises a sensing impedance connected across the output winding and said sensed signal processing circuit means is coupled across the sensing impedance.

4. A watt hour meter installation according to claim 2 wherein said sensing means comprises a sensing impedance connected acorss the output winding and said sensed signal processing circuit means is coupled across the sensing impedance.

5. A watt hour meter installation according to claim 2 wherein the respective positive and negative polarity peak detecting and holding circuit means are comprised by respective two stage operational amplifiers wherein a first stage operational amplifier has one input connected to said sensing means and a diode poled for a given polarity voltage connected in a feedback path between the output and the inverse input thereof, a diode poled in the same sense as the first diode connected intermediate the output of the first stage operational amplifier and one input to the second stage operational amplifier, a holding capacitor coupled between the one input to the second stage operational amplifier and a source of reference potential, the diodes in the negative and positive polarity peak detecting and holding circuit means being inversely connected relative to each other, and the second stage operational amplifiers in each channel having its output connected through a feedback resistor to the inverse input of its respective first stage operational amplifier; said summation circuit means comprises a third operational amplifier having first and second summing resistors connected between the inverse input thereof and the respective outputs of the second stage operational amplifiers of the positive and negative peak detecting and holding circuit means;

and said voltage to current signal conversion circuit means comprises a fourth operational amplifier having the output from said third operational amplifier connected to an inverse input terminal thereof, having a direct input terminal connected to the source of reference potential and having the compensating winding means connected in a feedback path between the output and the inverse input terminal thereof for converting the summation voltage signal from said third operational amplifier to a corresponding current signal of proportional value and appropriate polarity to null any D. C. component superimposed on the input supply alternating current.

6. A watt hour meter installation according to claim 4 wherein the respective positive and negative polarity peak detecting and holding circuit means are comprised by respective two stage operational amplifiers wherein a first stage operational amplifier has one input connected across said sensing impedance and a diode poled for a given polarity voltage connected in a feedback path between the output and the inverse input thereof, a diode poled in the same sense as the first diode connected intermediate the output of the first stage operational amplifier and one input to the second stage operational amplifier and a holding capacitor coupled between the one input to the second stage operational amplifier and a source of reference potential, the diodes in the negative and positive polarity peak detecting and holding circuit means being inversely connected relative to each other, and the second stage operational amplifiers in each channel having its output connected through a feedback resistor to the inverse input of its respective first stage operational amplifier; said summing circuit means comprises a third operational amplifier having first and second summing resistors connected between the inverse input thereof and the respective outputs of the second stage operational amplifiers of the positive and negative peak detecting and holding circuit means; and said voltage to current signal conversion circuit means comprises a fourth operational amplifier having the output from said third operational amplifier connected to an inverse input terminal thereof, having a direct input terminal connected to the source of reference potential and having the compensating winding means connected in a feedback path between the output and the inverse input terminal thereof for converting the summation voltage signal to a corresponding current signal of proportional value and appropriate polarity to null any D. C. component superimposed on the input supply alternating current.

7. The method of compensating for the effect of a D. C. component superimposed on a supply alternating current being measured by a watt hour meter installation comprising;
(a) sensing the supply alternating current having the D. C. component superimposed thereon and deriving a sensed signal output representative of both the superimposed D. C. component, and the supply A. C.,
(b) converting the sensed signal to a sensed voltage signal,
(c) peak detecting both the positive and negative peak values of the sensed voltage signal,
(d) summing together the positive and negative peak value signals to derive a summation signal representative of the D. C. component, and
(e) feeding back the summation signal in advance of a watt hour meter installation in a direction to null out the effect of the D. C. component superimposed on the supply alternating current being measured.

* * * * *